United States Patent
Xu et al.

(10) Patent No.: US 9,455,023 B1
(45) Date of Patent: Sep. 27, 2016

(54) WORDLINE UNDER-DRIVING USING A VIRTUAL POWER NETWORK

(71) Applicant: ORACLE INTERNATIONAL CORPORATION, Redwood Shores, CA (US)

(72) Inventors: Pangjie Xu, Santa Clara, CA (US); Hoyeol Cho, Redwood City, CA (US); Kanghoon Jeon, Albany, CA (US)

(73) Assignee: ORACLE INTERNATIONAL CORPORATION, Redwood Shores, CA (US)

(*) Notice: Subject to any disclaimer, the term of this patent is extended or adjusted under 35 U.S.C. 154(b) by 0 days.

(21) Appl. No.: 14/882,572

(22) Filed: Oct. 14, 2015

(51) Int. Cl.
*G11C 11/00* (2006.01)
*G11C 11/417* (2006.01)
*G11C 5/06* (2006.01)
*G11C 11/41* (2006.01)

(52) U.S. Cl.
CPC .............. *G11C 11/417* (2013.01); *G11C 5/06* (2013.01); *G11C 5/063* (2013.01); *G11C 11/41* (2013.01)

(58) Field of Classification Search
CPC ......... G11C 11/41; G11C 5/06; G11C 5/063; G11C 11/417
USPC .......................................... 365/154, 63, 129
See application file for complete search history.

(56) References Cited

U.S. PATENT DOCUMENTS

| 9,142,286 | B2 * | 9/2015 | Su | G11C 11/419 |
| 9,230,632 | B1 * | 1/2016 | Andre | G11C 8/08 |
| 9,286,218 | B2 * | 3/2016 | Andre | G06F 12/0806 |

\* cited by examiner

*Primary Examiner* — Fernando Hidalgo
(74) *Attorney, Agent, or Firm* — Kraguljac Law Group, LLC (57) ABSTRACT

Systems, methods, and other embodiments associated with improving a static noise margin of memory cells by using charge sharing to under-drive a wordline are described. In one embodiment, a system includes power logic to, in response to a memory request, connect a voltage source with a virtual power network to store an electric charge within the virtual power network based on a voltage from the voltage source. The virtual power network includes a network of interconnects that electrically connect a plurality of driver interconnects. The system includes wordline logic to under-drive a requested wordline of a plurality of wordlines by connecting the requested wordline with the virtual power network to share the electric charge stored in the virtual power network with the requested wordline. The wordline logic under-drives a voltage of the requested wordline to be lower than a source voltage provided by the voltage source.

20 Claims, 10 Drawing Sheets

Read Access Timing

WORDLINE UNDER-DRIVING USING A VIRTUAL POWER NETWORK

BACKGROUND

As semiconductor devices scale to smaller sizes with improvements in technology, new difficulties are encountered. For example, as components of memory cells in a static random-access memory (SRAM) become smaller, variations in operating characteristics of the memory cells may increase. The variations may manifest as differences in functionality between the memory cells. Some memory cells may be more susceptible to errors when being read from or written to because of relative voltages applied to the memory cells in relation to internal voltages of the memory cells used to store data. Accordingly, memory cells of the SRAM can fail to operate properly when manufactured at smaller scales.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be implemented as multiple elements or that multiple elements may be implemented as one element. In some embodiments, an element shown as an internal component of another element may be implemented as an external component and vice versa. Furthermore, elements may not be drawn to scale.

DETAILED DESCRIPTION

Systems, devices and methods are described herein associated with improving a static noise margin of memory cells by using charge sharing to under-drive a wordline. Under-driving the wordline refers to a technique for activating the wordline using a reduced voltage in relation to a source voltage. Activating the wordline in this way improves (increases) the static noise margin. An increased static noise margin permits the memory cell to handle additional noise which causes the memory cell to be less likely to erroneously flip between stored logic values resulting in data errors.

Consider a process for accessing a memory cell (such as, for example, an SRAM memory cell). In general, accessing the memory cell in a memory device includes applying a voltage to the memory cell using a respective wordline. Applying the voltage to the memory cell activates transistors within the memory cell that permit reading a value from the memory cell or writing a value to the memory cell.

The voltage applied to the memory cell via the wordline is generally a supply voltage (e.g., Vdd) in the memory device that powers the transistors and/or other components of the memory device and is connected with the wordline using a wordline driver. However, when the memory device is manufactured with transistors of a smaller size, using the supply voltage to power the wordlines can result in degraded static noise margins (SNM) within the memory cells. The degraded static noise margins result from, for example, physical properties of the smaller transistors and variations between transistors of a memory cell that are prevalent when manufacturing at the smaller sizes.

The static noise margin is a characteristic that quantifies an amount of electric noise that a memory cell can withstand without compromising an integrity of a stored logic value. That is, the static noise margin refers to the amount of "stray" electric charge that the memory cell can manage before incorrectly switching the stored logic value, which causes an error. The static noise margin of a memory cell is a function of a strength of a pass gate of the memory cell versus a strength of a pull down gate of the memory cell. By weakening the strength of the pass gate, i.e., reducing a voltage of the wordline, the SNM increases because the ratio of the strengths of the pass gate and pull down gate decreases.

For example, a logic value of "0" may be represented in a memory cell as a stored voltage of 0 mV. Electric noise associated with the memory cell when a respective wordline is activated may cause the stored voltage to actually be 150 mV. The stored value of 150 mV from the electric noise may be caused by crosstalk, electromagnetic interference, electrostatic interference, thermal noise, and so on. However, the stored voltage is still interpreted as a logic value of "0" because 150 mV is within the static noise margin of the memory cell. Thus, the memory cell can be said to have a SNM of at least 150 mV.

However, as memory cells are manufactured with smaller transistors over successive generations, static noise margins also tend to become smaller. Accordingly, a memory cell manufactured with smaller transistors may have a static noise margin of 100 mV. Thus, when a source voltage (Vdd) is applied to the wordline, noise associated with activating the wordline can exceed the static noise margin of the memory cell. Consequently, a stored logic value may be erroneously switched when the source voltage is applied to the wordline because of the degraded static noise margin.

Figure 1:
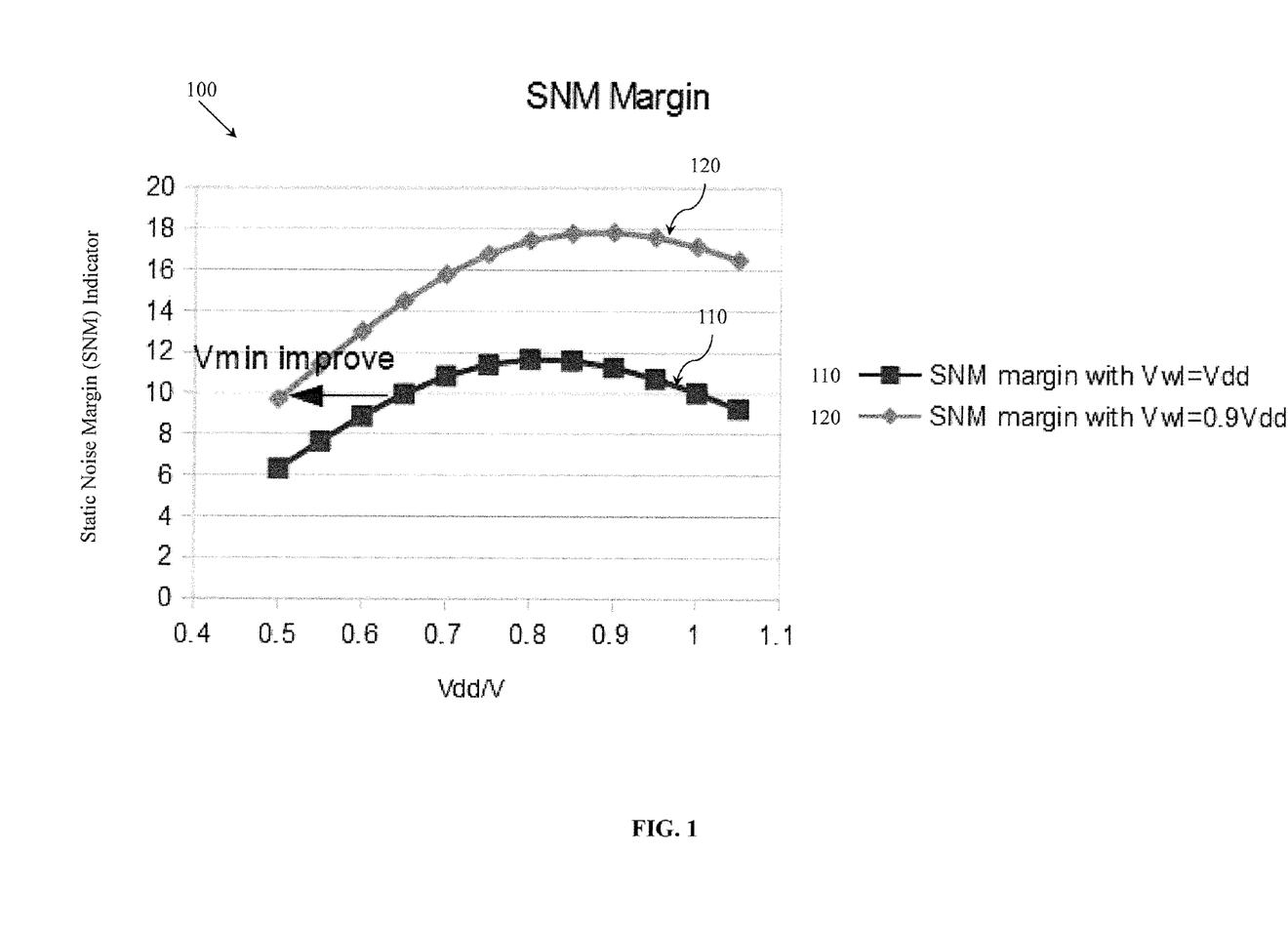
FIG. 1 illustrates a graph detailing static noise margins (SNM) for a memory cell with different voltages used to power a wordline.

FIG. 1 illustrates an example graph 100 of static noise margins (SNMs) for a memory cell when separate voltages are applied to a wordline. In the graph 100, an SNM 110 of a memory cell using a voltage equal to Vdd on the wordline is graphed in comparison to an SNM 120 of the memory cell using a voltage that is 90% of Vdd on the wordline. In FIG. 1, the static noise margin is represented along the y-axis in normalized indicator units. The normalized indicator units illustrate amplitudes of static noise margins for a memory cell. The x-axis illustrates different values for Vdd from which a voltage of the wordline (Vwl) is determined for each separate SNM 110 and 120.

As seen in the graph 100, the SNM 120 associated with the reduced voltage (0.9 Vdd) is improved in comparison to the SNM 110 throughout the range of tested voltages. This is because the disparity between the strength of the pass gate to the strength of the pulldown gate is increased when using 90% of Vdd. That is, the pass gate is, for example, weakened in comparison to the pull down gate by applying a lower voltage to the pass gate.

Accordingly, in one embodiment, a memory device is configured to under-drive a voltage of a wordline in order to improve static noise margins (SNMs) and thus permit the memory cells to withstand a greater amount of noise before encountering errors. As previously discussed, under-driving the wordline generally refers to activating the wordline with a reduced voltage that is less than the source voltage (Vdd), which is otherwise used to power the wordline and other elements of the memory device. In this way, static noise margins of memory cells can be improved in circuits and memory devices that are implemented with smaller transistors.

Figure 2:
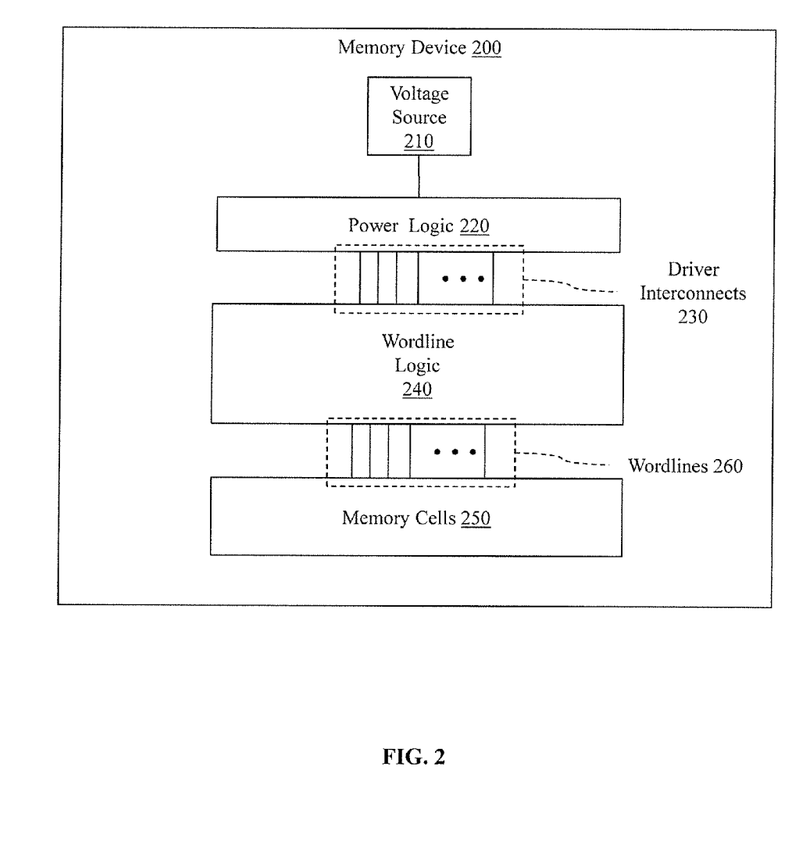
FIG. 2 illustrates one embodiment of a memory device associated with under-driving a wordline.

With reference to FIG. 2, one embodiment of a memory device 200 configured with components for under-driving a wordline to improve a static noise margin is illustrated. The memory device 200 includes a voltage source 210, power logic 220, driver interconnects 230 connecting the power logic with wordline logic 240 for each separate one of the wordlines 260, and memory cells 250. In general, the memory device 200 is a static random access memory (SRAM) such as a 6-transistor SRAM (6T SRAM) or similar device. The memory device 200 may be embedded within a processor or may be a standalone memory. In either case, the memory device 200 generally receives data and provides/outputs data to a processor (not shown) or other computing device via a bus or other operable data connection.

Furthermore, the memory device 200 stores data in the memory cells 250 and provides data from the memory cells 250. Each of the memory cells 250 have operating characteristics that are a function of, for example, manufacturing process variations and designed parameters of the memory cells 250. One of these characteristics is a static noise margin (SNM) that correlates with a voltage applied to the wordlines 260 as shown in FIG. 1.

When the memory device 200 receives a memory request to either read or write to the memory cells 250, the memory device 200 activates a requested wordline of the wordlines 260 by applying a voltage to the requested wordline via one of the wordlines logic 240. Applying the voltage to the requested wordline activates transistors of a requested memory cell to write a value or read a value depending on the memory request.

As noted, the static noise margin (SNM) correlates with the voltage applied to the wordline. That is, the SNM of a memory cell is a function of a strength of a pass gate (i.e., wordline connecting transistor) versus a strength of a pull down gate (i.e., ground/drain connecting transistor). Thus, greater voltage applied to the wordline result in a lessened static noise margin. Accordingly, the memory device 200 is configured to under-drive a voltage of the requested wordline by using a capacitance of the existing driver interconnects 230 to store an electric charge that causes the reduced voltage to be driven on the requested wordline. In this way, the static noise margin of the requested memory cell is improved from the voltage of the requested wordline being reduced, thereby, helping to avoid errors.

The memory device 200 is generally configured with a power source that powers various components. In one embodiment, the voltage used to power the memory device 200 is provided via the voltage source 210. The voltage source 210 is, for example, a metal wire interconnect that links the memory device 200 with a power source (e.g., voltage regulator) either within the memory device 200 or of a host device (not shown). The voltage source 210 provides a voltage that is generally referred to as "Vdd." The Vdd voltage is a voltage used by the memory device 200 to power the memory cells 250, sense amplifiers, control logic transistors and so on.

As illustrated in FIG. 2, the voltage source 210 connects to the power logic 220, which in turn connects with the driver interconnects 230. Components of the wordline logic 240 are disposed separately between the driver interconnects 230 and each of the wordlines 260 to separate the driver interconnects 230 and the virtual power network from the wordlines 260. The wordline logic 240 operates to switch a connection between respective wordlines 260 that connect with the memory cells 250 and the driver interconnects 230. Additional details of the driver interconnects 230 and the wordline logic 240 will be discussed in relation to FIG. 3.

Returning to the power logic 220, in one embodiment, the power logic 220 includes a network of interconnects that span the driver interconnects 230 in order to electrically connect the driver interconnects 230 together. A resulting structure formed from the network of interconnects and the driver interconnects 230 is referred to as a virtual power network and will be discussed in greater detail subsequently. However, in general, the virtual power network is a circuit formed from the driver interconnects 230 and the network of interconnects. The circuit of the virtual power network has a resulting combined capacitance formed by electrically uniting the existing structures of the driver interconnects 230. Thus, the circuit of the virtual power network can store an electric charge, which can be used for driving individual wordlines of the set of wordlines 260 as explained below.

Accordingly, in one embodiment, the power logic 220 includes transistors controlled by the power logic 220 for connecting the virtual power network with the voltage source 210 to store an electric charge. The power logic 220, for example, selectively connects the voltage source 210 with the virtual power network. The power logic 220 can, for example, select when to isolate the driver interconnects 230 from the voltage source 210 by actuating the transistors and connecting/disconnecting the voltage source 210 from the driver interconnects 230. Accordingly, the power logic 220 can store an electric charge within the virtual power network by using the transistors to selectively connect the voltage source 210. The capacitance of the existing driver interconnects 230 that form the virtual power network is then charged by the voltage source 210.

Figure 3:
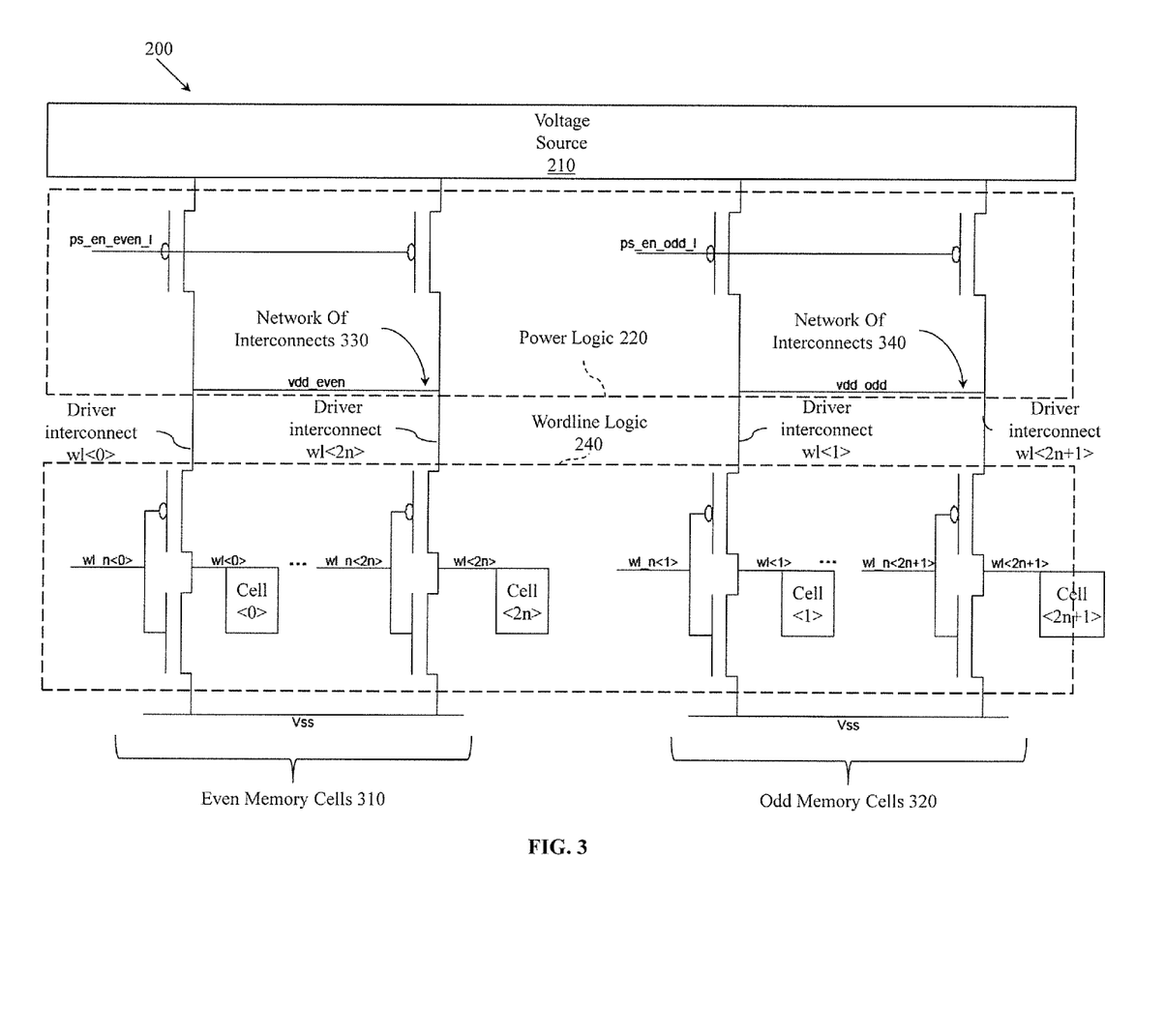
FIG. 3 illustrates another embodiment of a memory device associated with under-driving a wordline using an electric charge stored in a virtual power network.

To better understand the virtual power network and how the power logic 220 stores the electric charge, consider FIG. 3. FIG. 3 illustrates another embodiment of the memory device 200 of FIG. 2 with additional details of various circuits. In FIG. 3, the memory device 200 is separated into even and odd sections, multiple additional sections beyond even and odd may be implemented in other embodiments. For example, an even set of memory cells 310 and an odd set of memory cells 320 are each illustrated with associated structures that correlate to components shown in FIG. 2. The voltage source 210 is illustrated as a single source in FIG. 3 but, of course, may also be divided into additional separate sections. Additionally, FIG. 3 does not illustrate a comprehensive layout of the memory device 200. Instead, a portion of the memory cells are abbreviated with dots " . . . " to illustrate a first cell and a last cell in each set for purposes of brevity in the illustration. Furthermore, it should be understood that while many of the elements are discussed as being a single element, each of the elements may include separate even and odd corollaries. However, for purposes of simplicity of discussion the elements may be referenced as singular.

Additionally, the wordlines 260 are not explicitly labeled in FIG. 3. Instead, individual even wordlines wl<0>, wl<n> and odd wordlines wl<1> wl<2n+1> are illustrated to show that the wordlines 260 are comprised of a plurality of individual wordlines each connected with a separate wordline driver of the wordline logic 240. The power logic 220, as shown in FIG. 3 and as previously discussed, includes a network of interconnects 330 (Vdd_even) and a network of interconnects 340 (Vdd_odd) that each span separate sets (i.e., even and odd) of the driver interconnects 230. That is, for example, the network of interconnects 330 electrically connect the even driver interconnects 230 (i.e., driver interconnect wl<0> to driver interconnect wl<2n>) into a single electric grid of interconnects prior to the wordline logic 240. Thus, the network of interconnects 330 operate to form a power storage structure using the existing driver interconnects 230 that connect to wordline drivers associated with each separate one of the wordlines 260.

This power storage structure may be referred to as a virtual power network. The virtual power network has a capacitance for storing electric charge formed from electrically connecting the driver interconnects 230 and the network of interconnects. The virtual power network is "virtual" by virtue of storing the electric charge for purposes of powering a wordline using stored electric charge and not being a source in the same context as the voltage source 210. Thus, by configuring the network of interconnects to span the driver interconnects 230, each resulting virtual power network (i.e., vdd_even and Vdd_odd) has a capacitance that is sufficient to store an electric charge that can be used to under-drive a voltage on individual wordlines. In this way, stored electric charge within the driver interconnects 230 can be applied by a respective wordline driver of the wordline logic 240 to a selected/requested wordline to cause a reduced voltage on the requested wordline.

Accordingly, when the memory device 200 receives a memory request to access a memory cell, the power logic 220 actuates transistors that connect the voltage source 210 with the network of interconnects 330 or 340 depending on which memory cell is to be accessed. Connecting the voltage source 210 with the network of interconnects stores an electric charge within the respective virtual power network (i.e., within the wires of the driver interconnects and the network of interconnects). After the electric charge is stored, the power logic 220 disconnects the network of interconnects from the voltage source 210 to isolate the virtual power network from receiving further charge from the voltage source 210. The virtual power network is now charged. At this time, an actual voltage of the virtual power network may be, for example, equivalent to a source voltage of the voltage source 210.

Of course, while the virtual power network is being charged using the voltage source 210, the wordline logic 240 prevents the voltage source 210 from being connected to the memory cell. The wordline logic 240 prevents the voltage source 210 from being connected to the memory cell using wordline drivers that are transistors that act as switches as illustrated in FIG. 3. In this way, the power logic 220 stores the electric charge using either the network of interconnects 330 or 340 instead of the source voltage (Vdd) of the voltage source 210 being directly applied to the requested wordline and memory cell.

In one embodiment, once the power logic 220 disconnects the voltage source 210 from the virtual power network; the wordline logic 240 activates a transistor of a wordline driver to connect an appropriate requested wordline with the respective virtual power network that was previously charged. Connecting the charged virtual power network with the requested wordline while isolating the requested wordline from the voltage source 210, causes the stored electric charge to be shared with the requested wordline. Sharing the electric charge with the requested wordline under-drives a voltage of the requested wordline.

Sharing the electric charge, also referred to as "charge sharing," as used within this disclosure refers to sharing a stored charge of the virtual power network with a requested wordline to cause the wordline to be activated with a reduced voltage in comparison to a source voltage (vdd). For example, the wordline logic 240 is configured to distribute electric charge stored in the virtual power network to the requested wordline by connecting the requested wordline to a respective driver interconnect. In one embodiment, connecting the requested wordline and the respective driver interconnect instantaneously increases a capacitance of the virtual power network which causes a voltage driven on the requested wordline by the electric charge of the virtual power network to drop below a voltage of the voltage source Vdd. Thus, a voltage of the requested wordline is thereby "under-driven."

Accordingly, applying the electric charge to the requested wordline in this manner is referred to as "charge sharing" since the electric charge of the virtual power network (i.e., driver interconnects and respective network of interconnects) is shared with the requested wordline instead of directly connecting the voltage source 210 to the requested wordline.

As previously discussed, under-driving the wordline is a manner of activating the wordline with a reduced voltage in comparison to a voltage applied when directly connecting the voltage source 210. Furthermore, under-driving the wordline activates a requested memory cell while improving the static noise margin of the memory cell since the strength of a pass gate (i.e., transistor gate connected to the requested wordline) of the memory cell is reduced in comparison to the strength of a pull down gate. In this way, the static noise margin of memory cells in the memory device 200 is increased while manufacturing the memory cells with smaller scale transistors and using existing structures to store electric charge instead of adding additional structures.

Figure 4:
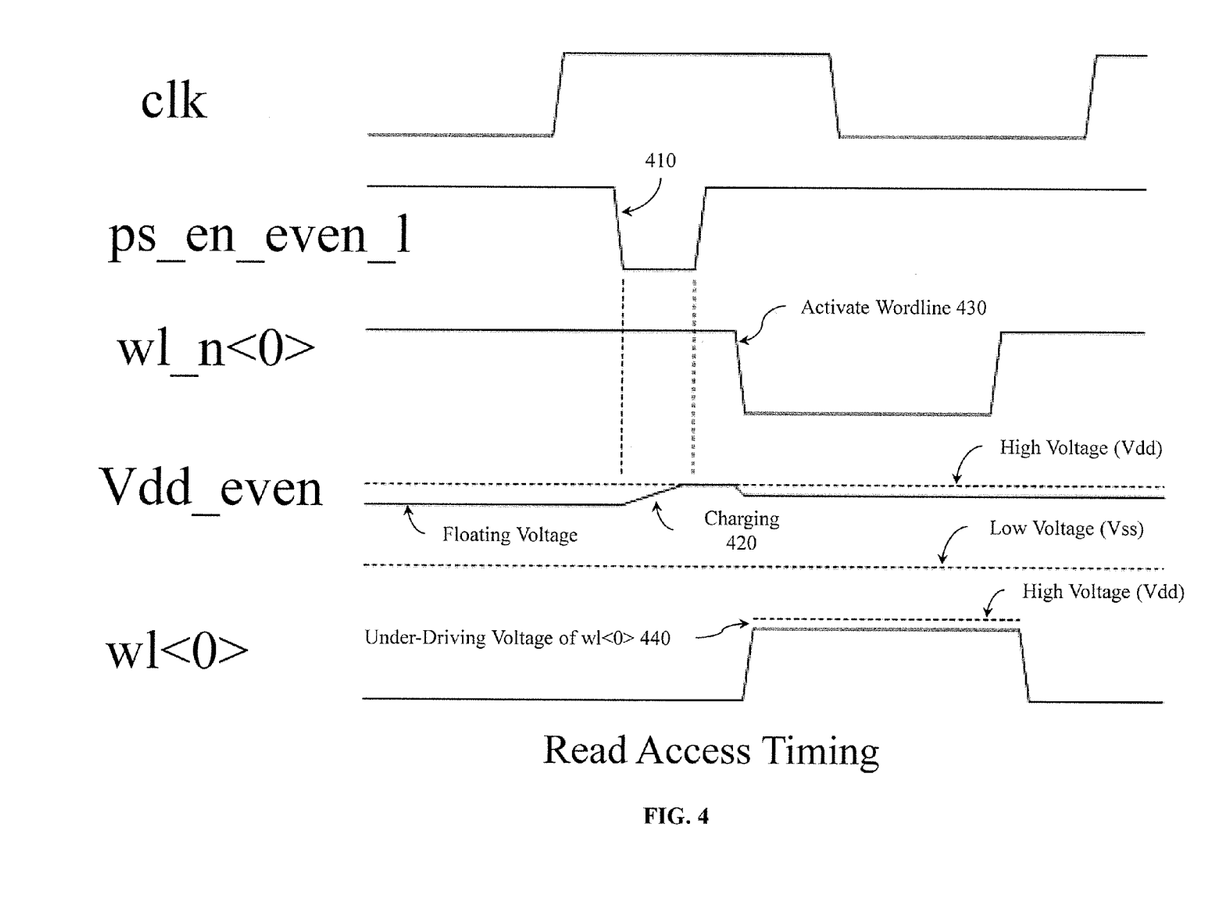
FIG. 4 illustrates one example of a timing diagram associated with reading from a memory cell.

FIG. 4 illustrates a timing diagram of signals in the memory device 200 when under-driving a wordline in the manner discussed in relation to FIG. 2 and FIG. 3. The labels of the respective signals correlate with labels of signal paths illustrated in FIG. 3. Thus, FIG. 4 will be discussed along with FIG. 3. Furthermore, FIG. 4 illustrates a read access of memory cell <0> as initiated by a memory request received in the memory device 200.

Accordingly, in response to the memory request, the power logic 220 changes the ps_en_even_I signal to low at 410, which activates the transistors of the power logic 220 to connect the voltage source 210 with the network of interconnects 330 (vdd_even) including the even driver interconnects 230. The network of interconnects 330 have a floating voltage prior to the power logic 220 connecting the voltage source 210. The floating voltage is an unknown voltage stored on the network of interconnects 330 from not being connected to a source or a drain.

Once the power logic 220 has stored the electric charge in the virtual power network comprised of the network of interconnects 330 and the even driver interconnects 230, the wordline logic 240 activates the wordline wl<0> at 430 using the control signal wl_n<0> to actuate the transistors of the respective wordline driver that connect the network of interconnects 330 with the wordline wl<0>. Consequently, the wordline logic 240 under-drives the wl<0> at 440 by sharing the electric charge stored within the network of interconnects 330 and the even driver interconnects 230 with the wl<0>, which is connected to memory cell <0>. While the wordline wl<0> is active with the under-driven voltage, data is read from the memory cell <0> via an associated bit-line (not shown) and sense amplifier (not shown). In this way, the static noise margin of the memory cell <0> is improved, thereby, reducing occurrences of errors (logic values switching) when reading from the memory cell while under-driving the wordline.

Figure 5:
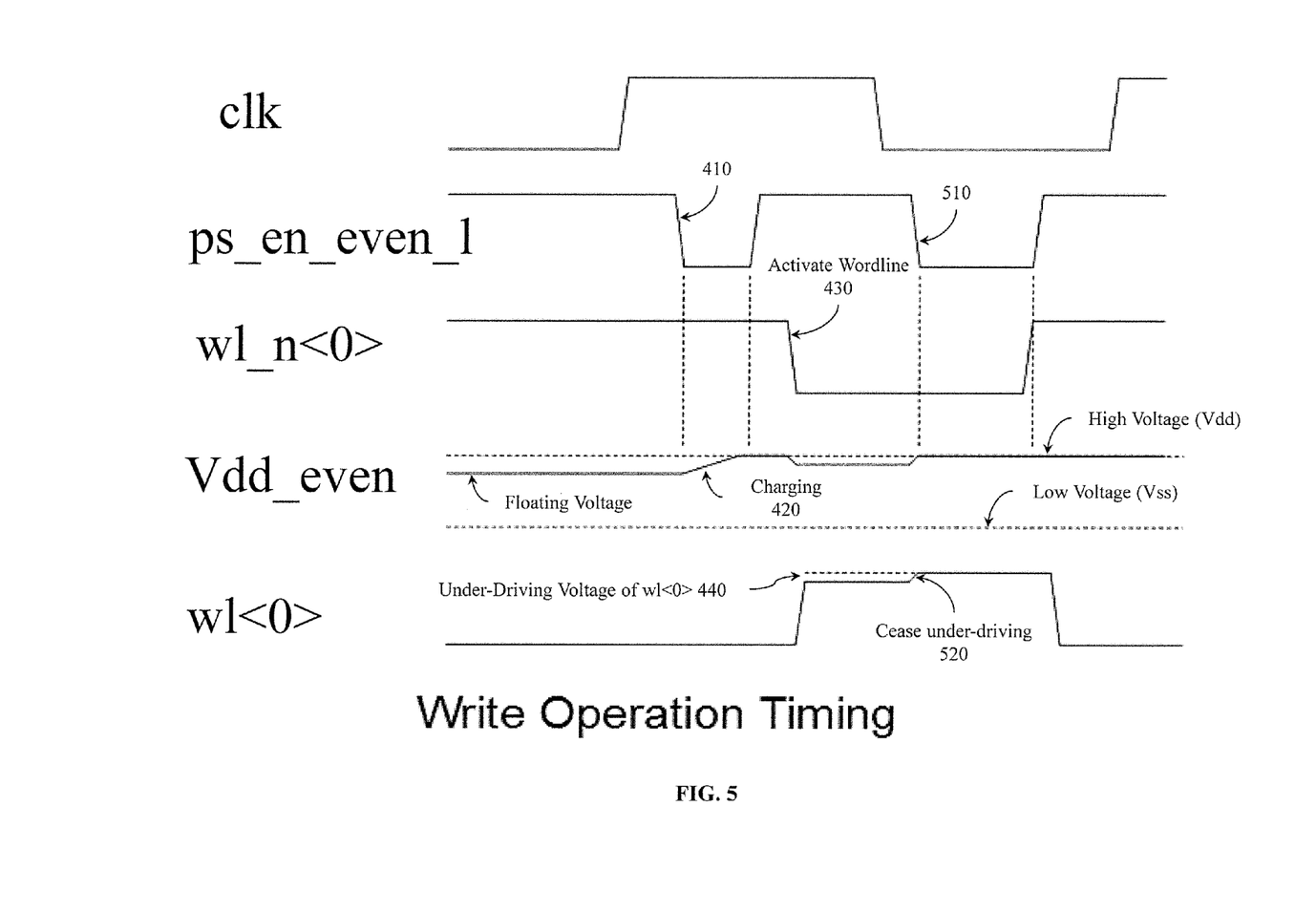
FIG. 5 illustrates one example of a timing diagram associated with writing to a memory cell.

With reference to FIG. 5, an example timing diagram of a write operation is illustrated. The write operation is similar to the read operation shown in FIG. 4 as seen from the presence of similar operations 410-440 in FIG. 5. However, for the write operation, while the wordline logic 240 continues to assert wl_n<0> to connect the wordline wl<0> with the network of interconnects 330, the power logic 220 also connects the voltage source 210 with the network of interconnects 330 at 510. Connecting the voltage source 210 with the network of interconnects 330 while the wordline wl<0> is also connected, effectively raises the voltage of the wl<0> to the source voltage (vdd) of the voltage source 210 at 520. Accordingly, when writing to a memory cell, the wordline logic 240 causes a reduced voltage to be under-driven on the requested wordline by sharing the electric charge stored on the virtual power network (Vdd_even) for a first portion of the time and then transitioning to powering the wordline with a direct connection to the voltage source 210. In this way, the static noise margin is increased for the memory cells in unselected columns when performing a write operation of selected columns. Furthermore, in one embodiment, the memory device 200 supports a column select feature that includes causing unselected columns to perform dummy-read operations during the under-driving of the wl<0> at 440. Accordingly, by implementing under-driving during the first portion of the write operation, as shown in FIG. 5, SNM is improved for the memory cells subject to the dummy read operation.

Figure 6:
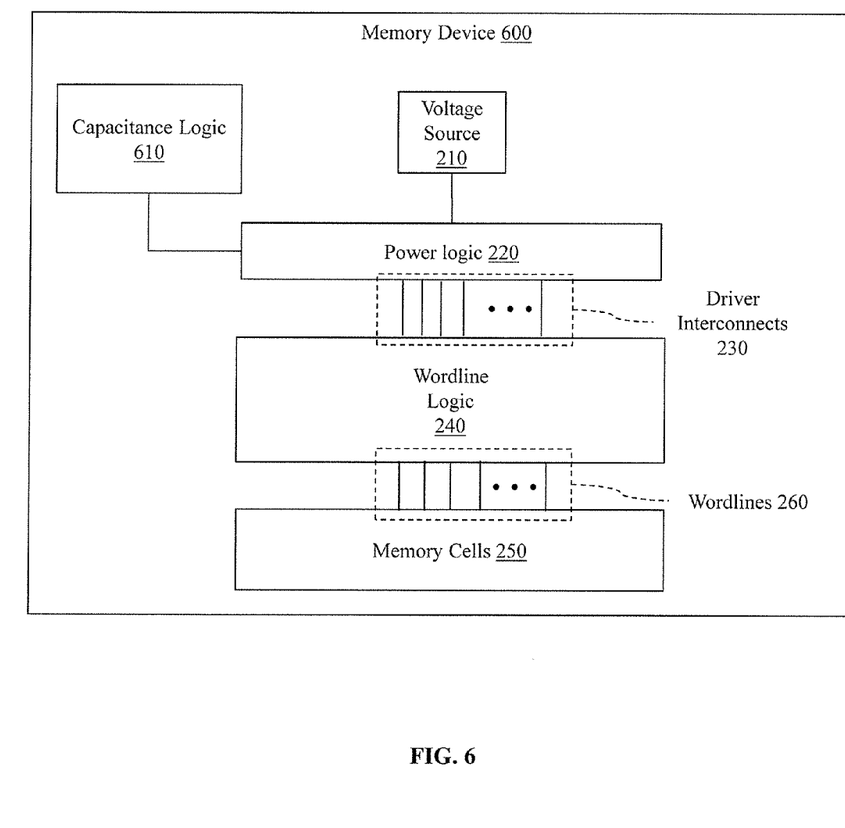
FIG. 6 illustrates one embodiment of a memory device associated with storing an electric charge in a virtual power network with a modifiable capacitance.

With reference to FIG. 6, one embodiment of a memory device 600 is illustrated. The memory device 600 is similar to the memory device 200 of FIG. 2 as seen by similar elements 210, 220, 230, 240, 250, and 260. However, the memory device 600 also includes capacitance logic 610. Remember that the network of interconnects of the power logic 220 operate to connect together the driver interconnects 230 to form a virtual power network with a combined capacitance that stores an electric charge for under-driving a wordline. However, the capacitance of the virtual power network may not, for example, be a precise capacitance value for storing an electric charge that under-drives the wordline to the extent desired.

Thus, the capacitance logic 610 is configured to modify a capacitance of the virtual power network by selectively enabling capacitors that are connected to the network of interconnects. That is, for example, the capacitance logic 610 adjusts an amount by which the wordline logic 240 under-drives the voltage of a wordline by activating one or more capacitors to increase a capacitance of the virtual power network. Of course, depending on a timing of when the capacitance logic 610 enables the one or more capacitors, the voltage that is under-driven on the wordline may be adjusted higher toward Vdd or may be adjusted lower. Timing of when the capacitors are connected with the virtual power network is discussed in greater detail with reference to FIG. 8 and FIG. 9.

Furthermore, in one embodiment, the capacitance logic 610 adjusts the capacitance according to one or more control inputs. For example, the capacitance logic 610 generates or otherwise receives one or more control inputs that are signals specifying which capacitors to activate and, for example, when to activate the capacitors. The control inputs may be provided by a memory controller (not shown), by a processor (not shown), by an input/output connection, or by the capacitance logic 610 itself to selectively enable capacitors.

In one embodiment, one or more registers in the capacitance logic 610 may be programmed when, for example, the memory device 600 is manufactured. Thereafter, the capacitance logic 610 generates the control inputs to adjust the capacitance when memory access requests are serviced. Alternatively, in one embodiment, the capacitance logic 610 receives the control inputs from a memory controller, processor or other device that specifies how to modify the capacitance. However, in either case, the capacitance logic 610 adjusts a capacitance of the virtual power network by selectively connecting individual capacitors with the virtual power network.

Figure 7:
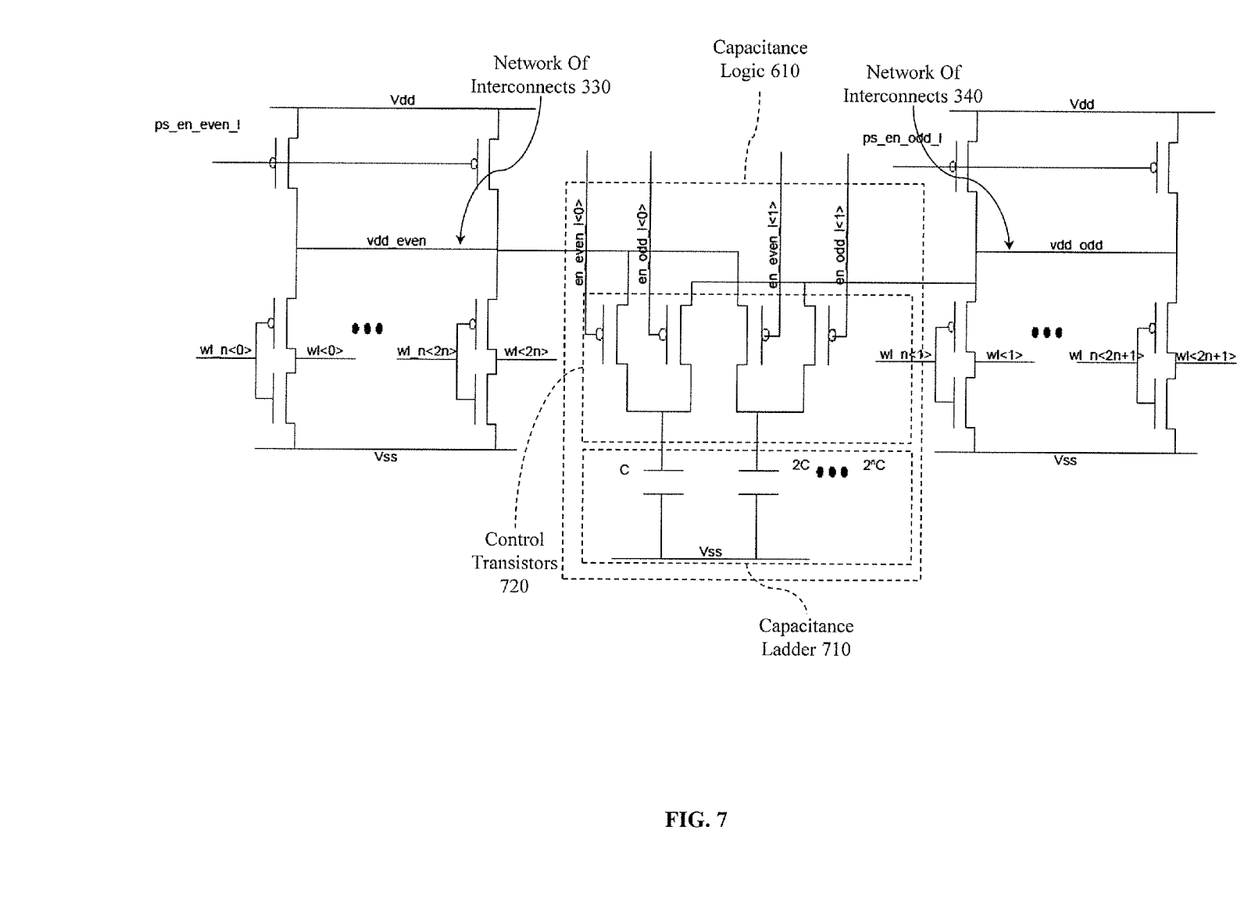
FIG. 7 illustrates another embodiment of a memory device that is associated with using under-driving a wordline.

To further understand operation of the capacitance logic 610, briefly consider FIG. 7. FIG. 7 illustrates a more detailed view of the memory device 600. Elements of FIG. 7 are similar to those of FIG. 3 with the addition of the capacitance logic 610. Accordingly, for purposes of brevity similar items will not be re-introduced.

The capacitance logic 610 includes a capacitance ladder 710. The capacitance ladder 710 includes a plurality of capacitors connected in parallel. The capacitors may have capacitances of the same or different values depending on a particular implementation. The capacitance logic 610 further includes control transistors 720 for activating select capacitors of the capacitance ladder 710.

That is, the capacitance logic 610 may selectively connect the capacitors to the virtual power networks (Vdd_even, Vdd_odd) formed by the network of interconnects 330 and 340 to selectively modify capacitances of the virtual power networks. Furthermore, by connecting the capacitors in parallel, activating additional capacitors operates in an additive manner to increase an overall selected capacitance in the capacitance ladder. In this way, the capacitance of the even and odd sections of the memory device 600 is individually adjustable by the capacitance logic 610.

Figure 8:
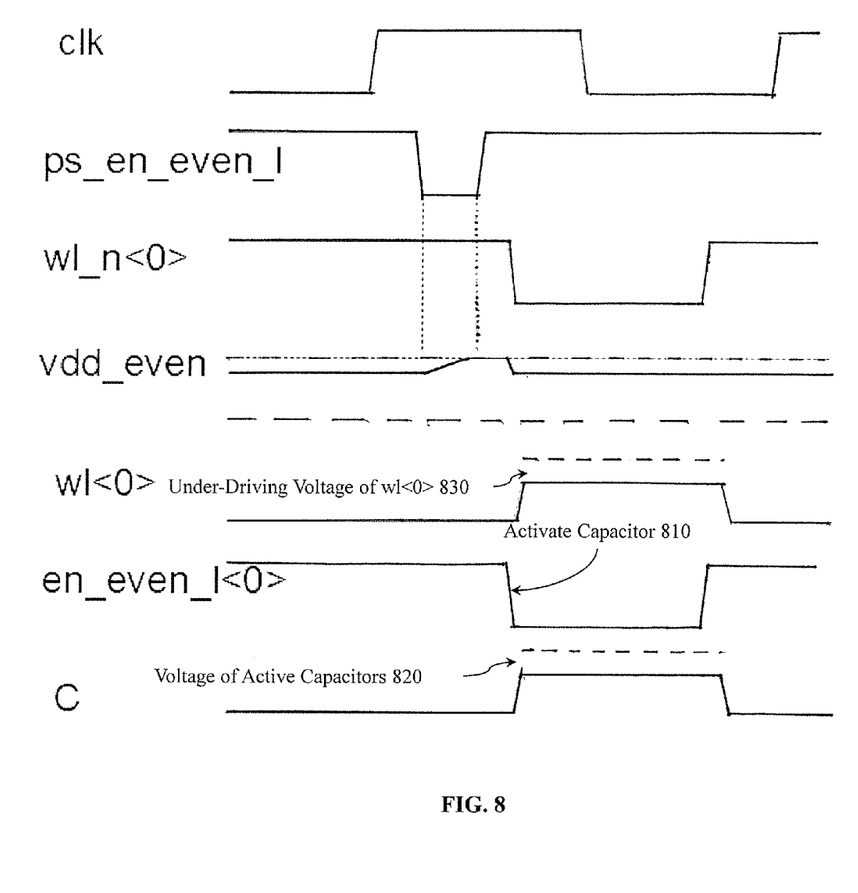
FIG. 8 illustrates one example of a timing diagram associated with under-driving a wordline using a selectable capacitance.

FIG. 8 illustrates an example timing diagram of a read operation using the memory device 600. The timing diagram 800 is similar to the timing diagram 400, accordingly, focus will be provided to portions relevant to the capacitance logic 610 and modifying a capacitance of the virtual power network. The capacitance logic 610 uses the control signal en_even_l<0> to activate a single additional capacitor at 810. Activating the additional capacitor causes the virtual power network to increase in capacitance after being charged. Thus, the virtual power network, Vdd_even in this example, experiences a decrease in voltage when the capacitor is activated at this point in timing after the virtual power network has been charged. Accordingly, a portion of the stored charge is used to charge the newly activated capacitor, thus, the virtual power network shares a charge for under-driving the wordline with a lesser voltage as shown at 820 and 830. Additionally, in one embodiment, increased and thus improved SNM are realized by the memory cell when under-driving the wordline as shown.

Figure 9:
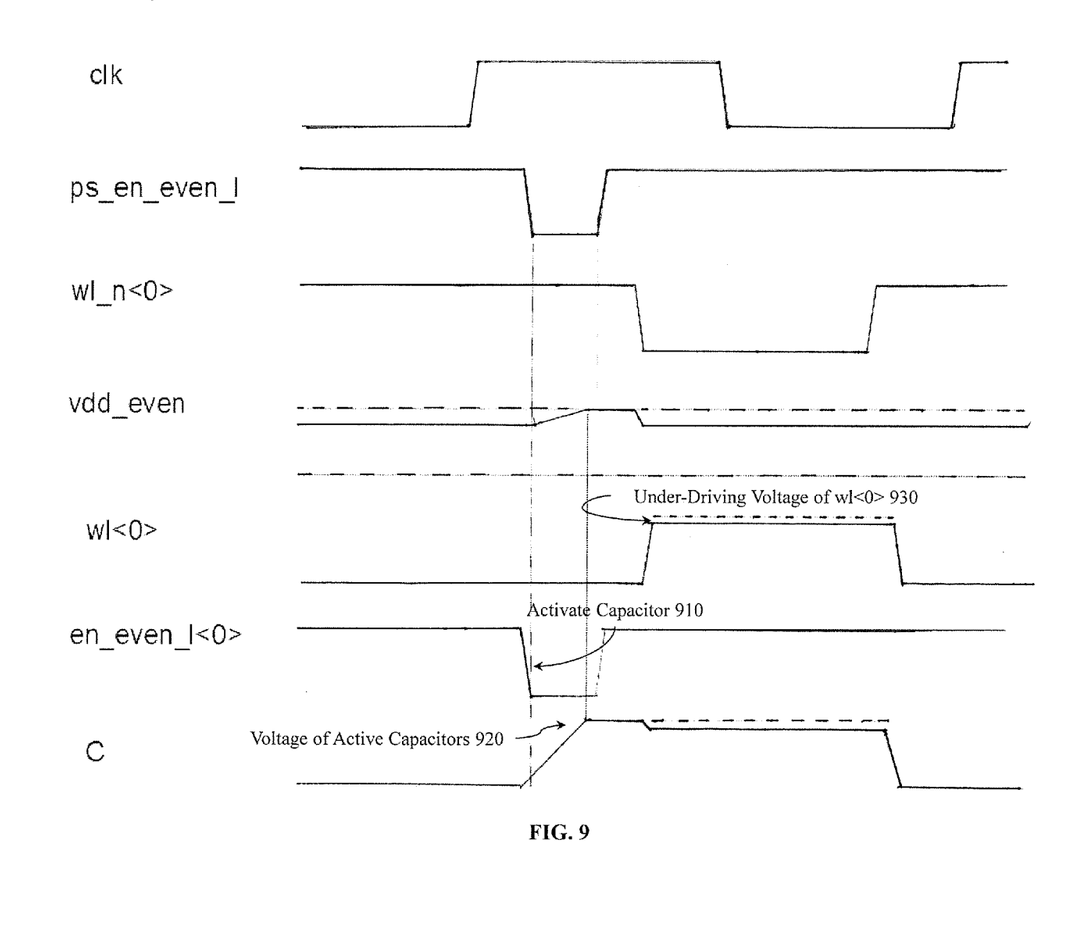
FIG. 9 illustrates another example of a timing diagram associated with under-driving a wordline using a selectable capacitance.

FIG. 9 illustrates an alternative timing diagram of a read operation using the memory device 600. For example, as shown in FIG. 9 an additional capacitor is activated at 910, prior to charging of the virtual power network by the voltage source. Activating the additional capacitor at 910, instead of at 810, as shown in FIG. 8, provides for storing a greater charge. As a result, a voltage of the capacitor is charged to Vdd at 920. In this way, sharing the charge with the wordline when under-driving, at 930, results in under-driving with a voltage that is reduced by a lesser amount in comparison to 830. As such, a capacitance of the virtual power network can be selectively modified to adjust an amount by which the virtual power network under-drives the wordline.

Figure 10:
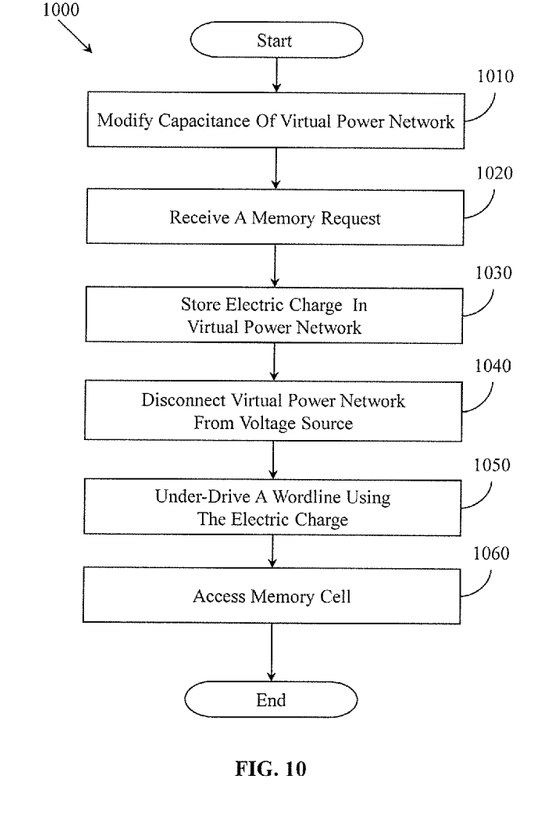
FIG. 10 illustrates one embodiment of a method associated with under-driving a wordline using an electric charge stored on a virtual power network.

Further aspects of under-driving a wordline will be discussed in relation to FIG. 10 and method 1000. For purposes of explanation, method 1000 will be discussed from the perspective of the memory device 600 of FIG. 6.

At 1010, a capacitance of the virtual power network is modified. Of course, while modifying the capacitance is discussed as a precursor, in various embodiments, the capacitance can be modified at any time during operation of the memory device 600. In this way, modifying the capacitance can be used to selectively reduce a voltage provided by the virtual power network when charge sharing to an exact extent that is determined according to when the capacitor is activated and, for example, by an amount of capacitance that is added to the virtual power network by activating additional capacitors.

Furthermore, in one embodiment, one or more of a plurality of capacitors arranged in a capacitance ladder are activated according to a control signal. The control signal may be generated by the capacitance logic 610 and indicates, for example, which capacitors to activate and when in order to achieve a desired capacitance within the virtual power network. In general, the control signal causes one or more control transistors associated with the capacitors to be activated so that the selected capacitors are electrically connected with the virtual power network. In this way, the capacitance of the virtual power network is adjustable and causes, in one embodiment, the virtual power network to store a specific electric charge relative to the voltage source (e.g., 90% of the voltage source).

At 1020, a memory request is received. The memory request is, for example, a request to access one or more memory cells of the memory device 600. The memory device 600, in one embodiment, decodes the memory request to determine which wordline, bit-line, and memory cell are associated with the memory request. Also, the memory device 600 may decode the memory request to determine whether the memory request is a read or write request.

Thus, receiving the memory request generally includes buffering the request, parsing the request, identifying one or more elements of the request and determining characteristics (e.g., memory address, access type) of the request from the parsing and identifying.

At 1030, an electric charge is stored in the virtual power network. In one embodiment, storing the electric charge includes actuating one or more transistors to connect the virtual power network with the voltage source 210. Additionally, storing the electric charge also includes isolating the virtual power network from the memory cells. Accordingly, the wordline logic 240 ensures that transistors (i.e., wordline drivers) connected between the driver interconnects and wordlines/memory cells are closed so that the memory cells are not activated.

At 1040, the virtual power network is disconnected from the voltage source. Once the electric charge has been stored in the virtual power network, the virtual power network is isolated from the voltage source to avoid inadvertently connecting the voltage source with the requested wordline. When in this state the virtual power network is charged and ready to share the charge within the driver interconnects and network of interconnects with a single requested wordline. Of course, while not explicitly set forth otherwise, the wordline is a metal wire interconnect that connects along a row of memory cells in the memory device 600. Accordingly, a single wordline connects with a plurality of memory cells, but ultimately activates a single memory cell that corresponds with an activated column (bit-line).

At 1050, a voltage on the requested wordline is under-driven by applying the electric charge (stored within the virtual power network) to the requested wordline. In one embodiment, under-driving the wordline includes connecting the virtual power network to the requested wordline and thus sharing the electric charge stored within the driver interconnects that comprise the virtual power network with the requested wordline. Of course, the driver interconnects are not connected with the memory cells since the wordline logic 240 functions to connect the requested wordline with the driver interconnects while maintaining other connections for the unselected wordlines as electrically open. In this way, a voltage of the requested wordline is under-driven using existing structure of the driver interconnects and the network of interconnects that span the driver interconnects. Accordingly, under-driving the wordline as disclosed herein uses, for example, less chip space by using existing structures of the virtual power network to serve multiple functions (e.g., power saving and wordline under-driving).

At 1060, the requested memory cell is accessed. The access may be a read or write access. In either case, the access occurs while the wordline is under-driven in order to improve the static noise margin in comparison to if the wordline had been driving using a direct connection with the voltage source. In general, reading from the memory cell includes causing the memory cell to provide a stored voltage on a bit-line, sensing the stored voltage and transforming the sensed voltage to a separate readout voltage that correlates to the appropriate logic state of the memory cell.

DEFINITIONS AND OTHER EMBODIMENTS

In one or more embodiments, the disclosed methods or their equivalents are performed by either: computer hardware configured to perform the method; or computer instructions embodied in a module stored in a non-transitory computer-readable medium where the instructions are configured as an executable algorithm configured to perform the method when executed by at least a processor of a computing device.

While for purposes of simplicity of explanation, the illustrated methodologies in the figures are shown and described as a series of blocks of an algorithm, it is to be appreciated that the methodologies are not limited by the order of the blocks. Some blocks can occur in different orders and/or concurrently with other blocks from that shown and described. Moreover, less than all the illustrated blocks may be used to implement an example methodology.

Blocks may be combined or separated into multiple actions/ components. Furthermore, additional and/or alternative methodologies can employ additional actions that are not illustrated in blocks. The methods described herein are limited to statutory subject matter under 35 U.S.C §101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment," "an embodiment," "one example," "an example," and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

A "data structure", as used herein, is an organization of data in a computing system that is stored in a memory, a storage device, or other computerized system. A data structure may be any one of, for example, a data field, a data file, a data array, a data record, a database, a data table, a graph, a tree, a linked list, and so on. A data structure may be formed from and contain many other data structures (e.g., a database includes many data records). Other examples of data structures are possible as well, in accordance with other embodiments.

"Computer-readable medium" or "computer storage medium," as used herein, refers to a non-transitory medium that stores instructions and/or data configured to perform one or more of the disclosed functions when executed. Data may function as instructions in some embodiments. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C §101.

"Logic," as used herein, represents a component that is implemented with computer or electrical hardware, a non-transitory medium with stored instructions of an executable application or program module, and/or combinations of these to perform any of the functions or actions as disclosed herein, and/or to cause a function or action from another logic, method, and/or system to be performed as disclosed herein. Equivalent logic may include firmware, a microprocessor programmed with an algorithm, a discrete logic (e.g., ASIC), at least one circuit, an analog circuit, a digital circuit, a programmed logic device, a memory device containing instructions of an algorithm, and so on, any of which may be configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. For example, if greater speed is a consideration, then hardware would be selected to implement functions. If a lower cost is a consideration, then stored instructions/executable application would be selected to implement the functions. Logic is limited to statutory subject matter under 35 U.S.C. §101.

An "operable connection," or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. §101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

What is claimed is:

1. A memory device, comprising:
   a plurality of wordlines connected to a plurality of memory cells;
   wordline logic connected between the plurality of wordlines and a plurality of driver interconnects;
   power logic connected to a voltage source and the plurality of driver interconnects, and including a network of interconnects that electrically connect the plurality of driver interconnects together to form a virtual power network, wherein, in response to a memory request, the power logic connects the voltage source with the virtual power network to store an electric charge within the virtual power network, and wherein the wordline logic under-drives a requested wordline of the plurality of wordlines associated with the memory request by connecting the requested wordline with the virtual power network to share the electric charge stored in the virtual power network with the requested wordline, and wherein the wordline logic under-drives a voltage of the requested wordline to be lower than a source voltage provided by the voltage source.

2. The memory device of claim 1, wherein the power logic to stores the electric charge by actuating one or more transistors to connect the virtual power network with the voltage source while the wordline logic isolates the requested memory cell associated with the requested wordline from being activated, wherein the power logic stores the electric charge using a capacitance of the network of interconnects and the plurality of driver interconnects that form the virtual power network, and wherein the network of interconnects include a metal wire that spans the plurality of driver interconnects to electrically connect the plurality of driver interconnects to form the virtual power network.

3. The memory device of claim 1, wherein the wordline logic under-drives the voltage of the requested wordline by providing the electric charge from the virtual power network instead of driving the requested wordline using a direct connection with the voltage source, wherein the wordline logic applies the electric charge of the virtual power network to the requested wordline to drive a voltage of the requested wordline to be less than a voltage of the voltage source, and wherein the power logic disconnects the virtual power network from the voltage source after storing the electric charge.

4. The memory device of claim 1, wherein the wordline logic under-drives the voltage of the requested wordline using the electric charge to increase a static noise margin of a requested memory cell of the plurality of memory cells when accessing the requested memory cell to fulfill the memory request in comparison to a static noise margin of the requested memory cell when directly connecting the voltage source with the requested wordline.

5. The memory device of claim 1, wherein the memory device is a 6 transistor static random access memory (6T SRAM).

6. The memory device of claim 1, further comprising:
capacitance logic connected to the network of interconnects and including:
(i) a plurality of capacitors connected in parallel, and
(ii) a plurality of control transistors connected between the plurality of capacitors and the network of interconnects, wherein the capacitance logic selectively connects the plurality of capacitors with the network of interconnects using the plurality of control transistors.

7. The memory device of claim 6, wherein the capacitance logic modifies a capacitance of the virtual power network by selectively connecting one or more of the plurality of capacitors to the virtual power network.

8. The memory device of claim 6, wherein the capacitance logic adjusts an amount by which the wordline logic under-drives the voltage by activating one or more of the plurality of control transistors to connect one or more of the plurality of capacitors with the network of interconnects and increase a capacitance of the virtual power network.

9. The memory device of claim 1, wherein the plurality of driver interconnects include a set of even driver interconnects and a set of odd driver interconnects, wherein the network of interconnects includes an even network of interconnects and an odd network of interconnects that form two separate virtual power networks, and wherein the set of even driver interconnects and the even network of interconnects are connected, and the set of odd driver interconnects and the odd network of interconnects are connected to form the two separate virtual power networks.

10. A computing system, comprising:
power logic to, in response to a memory request, connect a voltage source with a virtual power network to store an electric charge within the virtual power network based on a voltage from the voltage source, wherein the virtual power network includes a network of interconnects that electrically connect a plurality of driver interconnects; and
wordline logic to under-drive a requested wordline of a plurality of wordlines by connecting the requested wordline with the virtual power network to share the electric charge stored in the virtual power network with the requested wordline, and wherein the wordline logic under-drives a voltage of the requested wordline to be lower than a source voltage provided by the voltage source.

11. The computing system of claim 10, wherein the power logic stores the electric charge by actuating one or more transistors to connect the virtual power network with the voltage source while the wordline logic isolates a memory cell associated with the requested wordline from being activated, wherein the power logic stores the electric charge using a capacitance of the network of interconnects and the plurality of driver interconnects that form the virtual power network, and wherein the network of interconnects include a metal wire that spans the plurality of driver interconnects to electrically connect the plurality of wordlines to form the virtual power network.

12. The computing system of claim 10, wherein the wordline logic under-drives the voltage of the requested wordline by providing the electric charge from the virtual power network instead of driving the requested wordline using a direct connection with the voltage source, and wherein the power logic disconnects the virtual power network from the voltage source after storing the electric charge.

13. The computing system of claim 10, further comprising:
capacitance logic including: (i) a plurality of capacitors connected in parallel, and (ii) a plurality of control transistors connected between the plurality of capacitors and the network of interconnects, wherein the capacitance logic selectively connects the plurality of capacitors with the network of interconnects.

14. The computing system of claim 13, wherein the capacitance logic modifies a capacitance of the virtual power network by selectively connecting one or more of the plurality of capacitors to the virtual power network.

15. A method associated with under-driving a voltage of a selected wordline in a memory device, the method comprising:
receiving, in the memory device, a request to access a memory cell;

storing, using a plurality of driver interconnects of the memory device, an electric charge by activating at least one transistor that connects the plurality of driver interconnects with a voltage source of the memory device;

connecting the selected wordline to the plurality of driver interconnects to share the electric charge stored in the plurality of driver interconnects with the selected wordline and under-drive the voltage of the selected wordline with the voltage that is less than a voltage of the voltage source.

16. The method of claim 15, further comprising:

disconnecting the voltage source from the plurality of driver interconnects after storing the electric charge to isolate the plurality of driver interconnects from the voltage source.

17. The method of claim 15, wherein the voltage under-driven on the selected wordline using the electric charge is less than the voltage of the voltage source that is an operating voltage of the selected wordline.

18. The method of claim 15, wherein under-driving the wordline increases a static noise margin of the memory cell when accessing the memory cell in relation to a static noise margin associated with driving the wordline using the voltage of the voltage source.

19. The method of claim 15, further comprising:

configuring a capacitance ladder to modify a capacitance of the plurality of driver interconnects by activating one or more control transistors that connect the plurality of driver interconnects with capacitors of the capacitance ladder.

20. The method of claim 15, wherein storing the electric charge within the plurality of driver interconnects includes storing the electric charge in an even network or an odd network according to the request.

* * * * *

UNITED STATES PATENT AND TRADEMARK OFFICE
CERTIFICATE OF CORRECTION

PATENT NO. : 9,455,023 B1  
APPLICATION NO. : 14/882572  
DATED : September 27, 2016  
INVENTOR(S) : Xu et al.

Page 1 of 1

It is certified that error appears in the above-identified patent and that said Letters Patent is hereby corrected as shown below:

On the Title Page

Item (72) should read:

(72) Inventors: Pangjie Xu, Santa Clara, CA (US);
  Hoyeol Cho, Redwood City, CA (US);
  Kanghoon Jeon, Albany, CA (US);
  Jason T. Su, Cupertino, CA (US)

Signed and Sealed this
Twentieth Day of February, 2018

Andrei Iancu
*Director of the United States Patent and Trademark Office*